(12) United States Patent
Boufnichel et al.

(10) Patent No.: US 9,780,366 B2
(45) Date of Patent: Oct. 3, 2017

(54) SILICON MICROSTRUCTURING METHOD AND MICROBATTERY

(71) Applicant: STMicroelectronics (Tours) SAS, Tours (FR)

(72) Inventors: Mohamed Boufnichel, Monnaie (FR); Jean-Christophe Houdbert, Tours (FR)

(73) Assignee: STMICROELECTRONICS (TOURS) SAS, Tours (FR)

( * ) Notice: Subject to any disclaimer, the term of this patent is extended or adjusted under 35 U.S.C. 154(b) by 430 days.

(21) Appl. No.: 14/470,827

(22) Filed: Aug. 27, 2014

(65) Prior Publication Data

US 2015/0064567 A1    Mar. 5, 2015

(30) Foreign Application Priority Data

Aug. 29, 2013  (FR) ..................... 13 58256

(51) Int. Cl.
| | | |
|---|---|---|
| *H01M 4/38* | (2006.01) | |
| *H01L 31/0236* | (2006.01) | |
| *H01M 4/04* | (2006.01) | |
| *H01M 4/134* | (2010.01) | |
| *H01M 4/1395* | (2010.01) | |
| *C09K 13/00* | (2006.01) | |
| *H01L 21/3065* | (2006.01) | |
| *H01M 4/02* | (2006.01) | |

(52) U.S. Cl.
CPC ........ *H01M 4/386* (2013.01); *H01L 31/0236* (2013.01); *H01M 4/049* (2013.01); *H01M 4/134* (2013.01); *H01M 4/1395* (2013.01); *C09K 13/00* (2013.01); *H01L 21/3065* (2013.01); *H01M 2004/021* (2013.01); *H01M 2004/027* (2013.01)

(58) Field of Classification Search
CPC ...... H01M 4/386; H01M 4/049; H01M 4/134; H01M 4/1395; H01M 2004/021; H01M 2004/027; H01L 31/0236; H01L 21/3065; C09K 13/00

See application file for complete search history.

(56) References Cited

U.S. PATENT DOCUMENTS 5,219,769 A * 6/1993 Yonehara ............ H01L 29/1602
                                                 117/913
5,376,225 A   12/1994 Wakabayashi et al.
(Continued)

FOREIGN PATENT DOCUMENTS

JP          05-051174 B  * 7/1993

OTHER PUBLICATIONS

Portal et al., "Influence of incident ion beam angle on dry etching of silica sub-micron particles deposited on Si substrates", Thin Solid Films, vol. 518, No. 5, Dec. 2009, pp. 1543-1548.
(Continued)

*Primary Examiner* — Anita Alanko
(74) *Attorney, Agent, or Firm* — Slater Matsil, LLP

(57) ABSTRACT

A method for forming a rough silicon wafer including the successive steps of:
  performing a plasma etching of a surface of the wafer in conditions suitable to obtain a rough structure, and
  performing two successive ion milling steps, one at an incidence in the range of 0 to 10°, the other at an incidence in the range of 40 to 60° relative to the normal to the wafer.

18 Claims, 2 Drawing Sheets

(56) References Cited

U.S. PATENT DOCUMENTS

| | | | |
|---|---|---|---|
| 8,764,952 B2* | 7/2014 | Sato | C23F 4/00 |
| | | | 204/192.34 |
| 2002/0000552 A1 | 1/2002 | Morimoto et al. | |
| 2013/0008497 A1* | 1/2013 | Smirnov | B82Y 30/00 |
| | | | 136/256 |
| 2013/0071762 A1 | 3/2013 | Tajima et al. | |
| 2013/0149605 A1 | 6/2013 | Kakehata et al. | |
| 2014/0352779 A1* | 12/2014 | Smirnov | H01L 31/02363 |
| | | | 136/256 |

OTHER PUBLICATIONS

Tillocher et al., "Silicon cryo-etching of deep holes", Microelectronic Engineering, vol. 84, No. 5-8, May 2007, pp. 1120-1123.

* cited by examiner

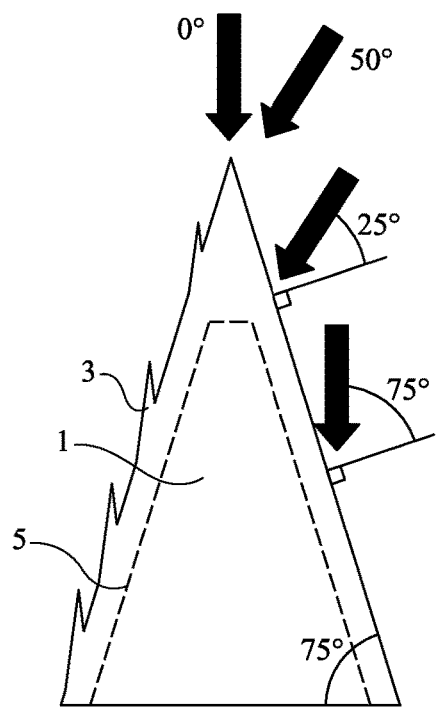
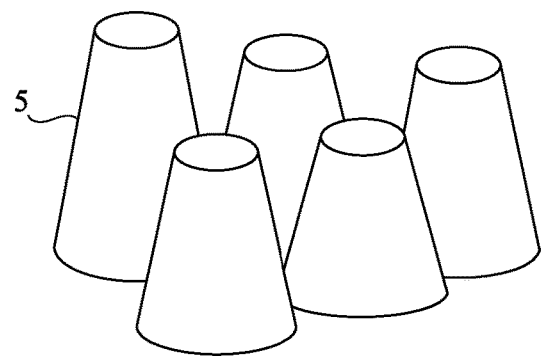
Fig 3
Fig 4
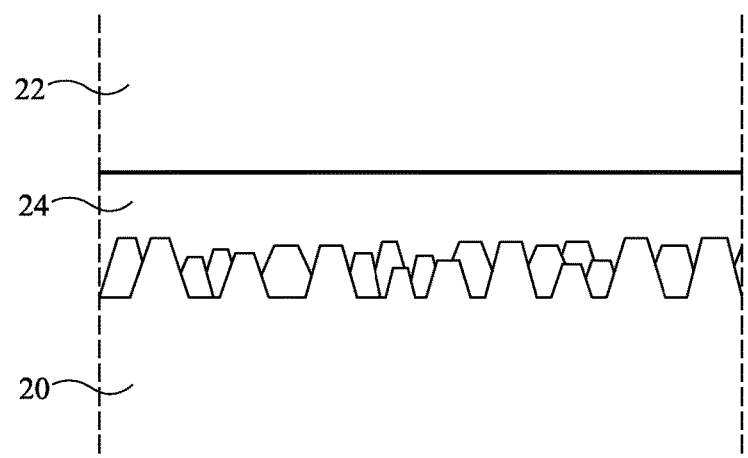
Fig 5

SILICON MICROSTRUCTURING METHOD AND MICROBATTERY

CROSS REFERENCE TO RELATED APPLICATION

This application claims the priority benefit of French Patent application number 13/58256, filed on Aug. 29, 2013, the contents of which is hereby incorporated by reference in its entirety to the maximum extent allowable by law.

BACKGROUND

The present disclosure relates to a method for microstructuring and roughening a silicon wafer surface and to a lithium microbattery structure.

DISCUSSION OF THE RELATED ART

Various techniques are known to roughen a surface of a silicon wafer, that is, to form microtips having a height of a few micrometers and a high density on this surface. A silicon surface treated in this way is said to be microstructured. Such a structure with such a microtip density and height traps visible white light. The silicon surface is then no longer reflective and seems black to an observer. Thereby, it is sometimes spoken of black silicon in the art.

A first technique to microstructure a silicon wafer surface is to form a mask and then to etch the unmasked areas of the wafer. Such a microphotolithography method provides a perfectly regular result but is difficult to implement and does not enable to go below dimensional limits inherent to the mask.

A second technique comprises forming perforations by means of pulsed laser spots, with or without masking the surface to be treated. Such a method is difficult and long to implement.

A third technique comprises performing an etching in the presence of a plasma, for example, a fluorinated plasma to which an etching inhibitor has been added, for example, oxygen or a fluorinated carbon element, for example, $C_4F_8$. This method is particularly simple to implement and provides results such as illustrated in FIG. 1: a large number of main peaks 1 are formed at the silicon surface. However, each peak is irregular and comprises serrations (secondary peaks) 3.

The presence of such pointed and irregular peaks as well as of the auxiliary peaks results in that the obtained rough structure is difficult to use (tip effect, lack of robustness of the structure). Indeed, in microelectronic, a known application of rough surfaces is to form capacitors by depositing on the rough structure a thin conformal layer of insulator followed by a conductive layer forming the second electrode of the capacitor, the substrate of which forms the first electrode. If this structure comprises too strongly marked tips, it becomes impossible to deposit a conformal layer without for it to break in places.

A simple-to-implement method of regular microstructuring of the surface of a silicon wafer is thus needed.

Further, lithium or lithium-ion microbatteries comprising a negative silicon electrode having lithium ions implanted therein are known. Such a negative electrode is separated from a positive electrode, for example, made of $LiCoO_2$ or of another material such as $Li_xMn_yO_z$, $LiNi_xMn_{(2-x)}O_z$, $Li_xTi_yS_z$, $Metal_x S_y$, $Metal_x P_y$, by an electrolyte. The electrolyte preferably is a solid electrolyte, for example, a lithium phosphorus oxynitride currently called LiPON or ion gel or polymer. The electrolyte may be deposited by different techniques, for example, by PVD (physical vapor deposition), sol-gel, coating or other.

Such microbatteries provided with a negative silicon electrode have various disadvantages. In particular, during the silicon lithiation, cracks tend to appear in the negative electrode silicon wafer, which cracking is due to the volume expansion of silicon when lithium inserts therein. Such a deterioration of the solid silicon causes a fast decrease of the battery lifetime. It is also desired to increase the charge and discharge speeds of a lithium microbattery and to decrease its internal resistance.

SUMMARY

Thus, silicon wafer microstructuring methods are desired to be improved.

The characteristics of lithium microbatteries are also desired to be improved.

An embodiment provides a method for forming a rough silicon wafer comprising the successive steps of:

performing a plasma etching of a surface of the wafer in conditions suitable to obtain a rough structure, and performing two successive ion milling steps, one at an incidence in the range of 0 to 10°, the other at an incidence in the range of 40 to 60° relative to the normal to the wafer.

According to an embodiment, the plasma etching is a cryogenic etching, the wafer being maintained at a temperature lower than −70° C.

According to an embodiment, the wafer is maintained at a temperature in the range of −90 to −110° C.

According to an embodiment, the method comprises a prior calibration step during which the pitch between microtips is determined according to the cryogenic temperature of the wafer.

According to an embodiment, the different steps are adjusted so that the roughnesses have the shape of cone frustums having a height between 1 and 2 μm with a distance between cone bases in the range from 0 to 1 μm.

An embodiment provides a lithium battery having a negative electrode comprising a silicon wafer containing lithium, having its internal surface provided with roughnesses in the form of cone frustums having a height in the range from 1 to 2 μm with a distance between cone bases in the range from 0 to 1 μm.

According to an embodiment, the silicon wafer having a rough surface is obtained by the above method.

The foregoing and other features and benefits will be discussed in detail in the following non-limiting description of specific embodiments in connection with the accompanying drawings.

BRIEF DESCRIPTION OF THE DRAWINGS

FIG. 3 schematically illustrates a serrated microtip having an ion milling applied thereto;

FIG. 4 schematically shows a structure obtained by the method described herein; and FIG. 5 shows an embodiment of a lithium microbattery.

As usual in the representation of integrated circuits, the various drawings are not to scale.

DETAILED DESCRIPTION

Figure 1:
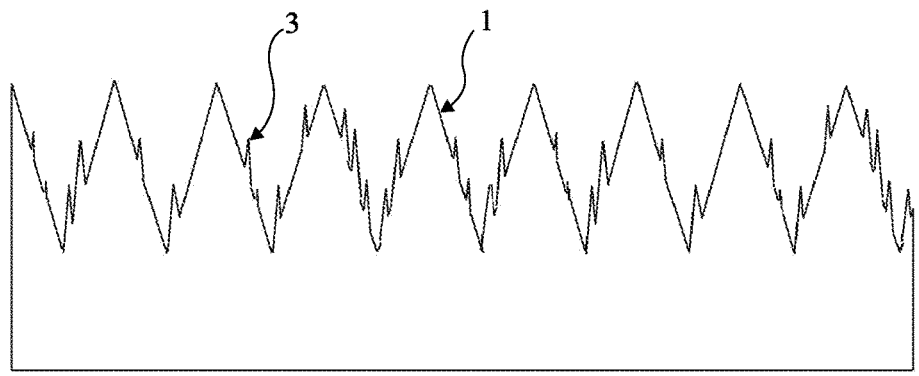
FIG. 1 is a cross-section view showing a portion of the upper surface of a silicon wafer microstructured by plasma etching.

As previously indicated, FIG. 1 shows the result of a plasma etching with no masking of a silicon substrate in conditions capable of roughening the silicon surface. The various known methods generally provide main peaks 1 of irregular shapes, having secondary peaks 3, also having irregular shapes, protruding therefrom. Further, with known methods, the main peaks have a highly variable distribution.

To obtain a regular and dense distribution of the main peaks and obtain the "black silicon" effect, it is here more specifically provided to use an etching by a fluorinated plasma comprising a mixture of $SF_6$ and of oxygen which breaks down in the plasma to provide active fluorine, oxygen, and $SF_x$ atoms. A cryogenic method is further preferred, that is, it is preferred to place the substrate on a substrate carrier setting a temperature lower than −70° C., for example, in the order of −100° C. It can then be observed that by simply varying the temperature of the substrate carrier, and by using conventional plasma conditions, a relatively regular distribution of the main peaks and relatively regular heights of these peaks are obtained. Their density and size may be calibrated by varying the plasma parameters such as the temperature, biasing, and degree of passivation (ratio in % of the etching gas flow rate to the inhibiting gas flow rate). A non-limiting example of conventional plasma condition in an ICP (inductively coupled plasma) reactor powered by a radio-frequency (RF) generator, is the following (for substrates having a 200-mm diameter): a delivered source power of approximately 1,000 W, a flow rate of $SF_6$ of 200 sccm (Standard Cubic Centimeter per Minute), an oxygen flow rate of 22 sccm (ratio $SF_6/O_2$ being greater than or equal to 10%), a bias voltage (provided by a second RF generator) of approximately 50 volts and a substrate temperature around −100° C.

Currently, main peaks having a height in the range of 1 to 2.5 μm, with a spacing between bases of the main peaks in the range of 0 to 2 μm, can be obtained. In any case, the use of cryogenic conditions appears to provide much more regular main peaks.

However, even with such an advantage in terms regularity of the main peaks, a structure of the type of FIG. 1 can in practice hardly be used due to the highly pointed character of the main and secondary peaks which, according to the envisaged applications, forbids the deposition of conformal layers and/or risk creating various electric tip effects.

Figure 2:
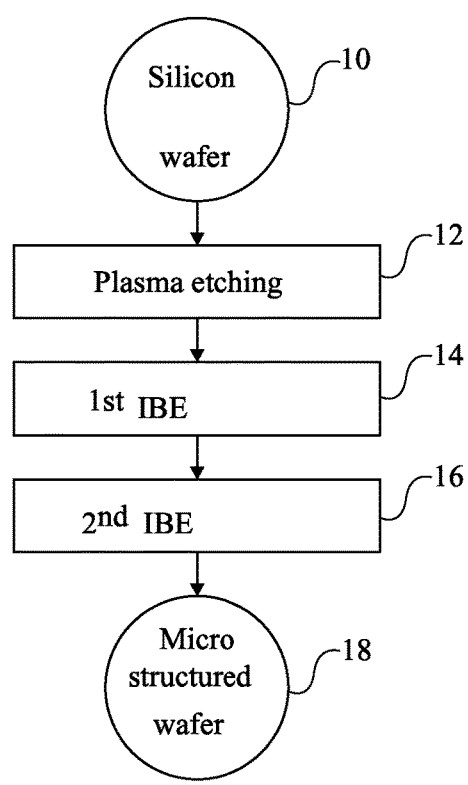
FIG. 2 shows steps of the method described herein.

It is thus here provided to use a method in several steps, such as illustrated in FIG. 2.

It is started from a silicon wafer 10, which is submitted to a plasma etching (step 12) in order to roughen it. Any suitable plasma etching is appropriate. It will here be preferred to use a cryogenic fluorinated plasma etching in the presence of oxygen.

Then, at a step 14, a first bombarding corresponding to an IBE (Ion Beam Etching) ion milling where an ion beam having a mechanical milling effect on the structure is sent onto it, is performed. Such ions currently are argon ions. The first ion milling is preferably performed by using a beam substantially normal to the surface of the silicon wafer, possibly in a range from 0 to 10° relative to the normal to the surface. The first milling appears to tend to eliminate secondary peaks 3 and to flatten the tops of the main peaks. The ion flow enabling the ion milling is obtained from an ICP source powered with a RF generator and a system of beam acceleration and collimating grids. The ion milling etching conditions capable of being used may be, as a non-limiting example (for substrates having a 200-mm diameter): a source power between 200 and 1,500 W, for example, in the order of 800 W, an argon flow of a few tens of sccm, for example, in the order of 20 sccm, an ion beam power in the range of 200 to 1,000 eV, for example, in the order of 500 eV. The pressure in the etch chamber is for example in the range of $10^{-2}$ to $10^{-1}$ Pa, for example, in the order of $5 \times 10^{-2}$ Pa, and the temperature of the substrate carrier is for example in the order of 5° C.

A second ion milling step 16 is then carried out under a stronger incidence, for example with an angle of incidence in the range of 40 to 60°, for example, 50°, relative to the normal to the wafer plane. A microstructured wafer 18 is then obtained. During the two ion milling steps, the wafer is rotated.

FIG. 3 illustrates a very simplified example of a main peak 1 comprising secondary peaks 3, such as obtained after a plasma etching. On this peak are performed successive ion milling actions at angles of 0° and 50° relative to the normal to the wafer plane, that is, 25° and 75°, respectively, relative to the normal to a plane containing a baseline of the peak, assuming that the peak is substantially a cone having a 75° base angle with respect to the wafer plane. The final structure has a shape substantially corresponding to frustum 5 illustrated in dotted lines in FIG. 3.

FIG. 4 is a perspective view of the final structure. Frustum structures 5 having regular shapes and variable heights in a range from 10 to 30% appear to have been obtained. By using usual etching conditions, with, for example, successive ion milling steps of 5 minutes each, such frustum structures may have a base diameter from 1 to 1.5 μm, a height from 1 to 2 μm, for example, 1.5 μm, a top diameter in the range from 0.3 to 0.5 μm, and a distance between cone bases from 0 to 1 μm.

FIG. 5 shows a lithium or lithium-ion cell, also called lithium or lithium-ion microbattery. Such a cell comprises a negative electrode 20 and a positive electrode 22 between which is placed an electrolyte 24. Negative electrode 20 is formed of a lithium-filled silicon wafer. The electrolyte may be the product designated by trademark LiPON. Positive electrode 22 is currently based on $LiCoO_2$. The positive electrode may also be made of compounds selected from the group comprising: $Li_xMn_yO_z$, $LiNi_xMn_{(2-x)}O_z$, $Li_xTi_yS_z$, $Metal_xS_y$, $Metal_xP_y$.

As shown in FIG. 5, it is here provided for negative electrode 20 to be provided with roughnesses. As an example, the thickness of electrolyte 24 (above the peaks) is in the range from 2 to 5 μm and the roughnesses have a height from 1 to 2 μm. The roughnesses advantageously have the frustum shape obtained by the previously-described method, which enables to avoid any breakdown by tip effect.

It can be acknowledged that with such a structure, during the silicon lithiation, resulting in an anneal having a high lithium content such as $Li_{15}Si_4$ or $Li_{27}Si_5$, no cracks are created in the silicon wafer. This is imputed to the fact that regular roughnesses absorb the stress.

Further, the absorption and the desorption of lithium by negative electrode 20 occur better than in the case where there are no roughnesses. It can be observed that such a microbattery has an accelerated charge or discharge speed. This is probably due to the strong interaction between roughnesses and the electrolyte.

The increase of the surface area of contact with the electrolyte also causes a decrease of the internal microbattery resistance.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A method for processing a silicon wafer comprising the successive steps of:
    performing a plasma etching of a surface of the wafer in conditions suitable to obtain a structure, and
    performing two successive ion milling steps, one at an incidence in a range of 0 to 10°, the other at an incidence in a range of 40 to 60° relative to the normal to the wafer.

2. The method of claim 1, wherein the plasma etching is a cryogenic etching, the wafer being maintained at a cryogenic temperature lower than −70° C.

3. The method of claim 2, wherein the cryogenic temperature is in a range of −90 to −110° C.

4. The method of claim 2, further comprising a prior calibration step during which a pitch between microtips is determined according to the cryogenic temperature of the wafer.

5. The method of claim 1, wherein the different steps are adjusted so that the surface of the wafer comprises cone frustums having a height between 1 and 2 μm with a distance between cone bases in the range of 0 to 1 μm.

6. A method for forming a silicon wafer comprising:
    performing a plasma etching of a surface of the wafer;
    after performing the plasma etching, performing a first ion milling with ions impinging the wafer at a first incidence angle relative to the normal to the wafer; and
    after performing the plasma etching and the first ion milling, performing a second ion milling with the ions impinging the wafer at a second incidence angle relative to the normal to the wafer, the second incidence angle being different from the first incidence angle.

7. The method of claim 6, wherein the first incidence angle is in a range of 0 to 10°, the second incidence angle is in a range of 40 to 60°.

8. The method of claim 6, wherein the plasma etching is a cryogenic etching, the wafer being maintained at a cryogenic temperature lower than −70° C.

9. The method of claim 8, wherein the cryogenic temperature is in the range of −90 to −110° C.

10. The method of claim 8, further comprising a prior calibration step during which a pitch between microtips is determined according to the cryogenic temperature of the wafer.

11. The method of claim 6, wherein after performing the second ion milling, the wafer comprises cone frustums having a height between 1 μm and 2 μm.

12. The method of claim 6, wherein a distance between bases of the cone frustums is in the range of 0 to 1 μm.

13. A method for forming a lithium battery, the method comprising:
    performing a plasma etching of a surface of a lithium filled semiconductor wafer;
    forming a plurality of cone frustums protruding from the semiconductor wafer by
        after performing the plasma etching, performing a first ion milling with ions impinging the semiconductor wafer at a first incidence angle relative to the normal to the semiconductor wafer; and
        after performing the plasma etching and the first ion milling, performing a second ion milling with the ions impinging the wafer at a second incidence angle relative to the normal to the semiconductor wafer, the second incidence angle being different from the first incidence angle.

14. The method of claim 13, wherein the first incidence angle is in a range of 0 to 10°, the second incidence angle is in a range of 40 to 60°.

15. The method of claim 13, wherein the plasma etching is a cryogenic etching, the wafer being maintained at a cryogenic temperature lower than −70° C.

16. The method of claim 15, wherein the cryogenic temperature is in a range of −90 to −110° C.

17. The method of claim 15, further comprising a prior calibration step during which a pitch between microtips is determined according to the cryogenic temperature of the wafer.

18. The method of claim 13, wherein after performing the second ion milling, the cone frustums have a height between 1 μm and 2 μm.

* * * * *